US009230824B2

(12) United States Patent
Takayama et al.

(10) Patent No.: US 9,230,824 B2
(45) Date of Patent: Jan. 5, 2016

(54) METHOD OF MANUFACTURING SEMICONDUCTOR DEVICE

(71) Applicant: TOKYO ELECTRON LIMITED, Tokyo (JP)

(72) Inventors: Wataru Takayama, Miyagi (JP); Shoichiro Matsuyama, Miyagi (JP); Susumu Nogami, Miyagi (JP); Daisuke Tamura, Miyagi (JP); Kyosuke Hayashi, Miyagi (JP); Jun Kawanobe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/574,565

(22) Filed: Dec. 18, 2014

(65) Prior Publication Data

US 2015/0179466 A1 Jun. 25, 2015

(30) Foreign Application Priority Data

Dec. 19, 2013 (JP) ................................ 2013-262742

(51) Int. Cl.

| | |
|---|---|
| ***H01L 21/308*** | (2006.01) |
| ***H01L 21/3065*** | (2006.01) |
| ***H01L 21/311*** | (2006.01) |
| ***H01L 21/3213*** | (2006.01) |
| ***H01J 37/32*** | (2006.01) |

(52) U.S. Cl.

CPC ..... *H01L 21/31116* (2013.01); *H01J 37/32091* (2013.01); *H01L 21/31144* (2013.01); *H01L 21/32137* (2013.01)

(58) Field of Classification Search

None

See application file for complete search history.

(56) References Cited

U.S. PATENT DOCUMENTS

| | | | | |
|---|---|---|---|---|
| 6,159,860 | A * | 12/2000 | Yang | H01L 21/30604 257/E21.219 |
| 2008/0054338 | A1 * | 3/2008 | Jang | H01L 21/28273 257/316 |
| 2012/0149201 | A1 * | 6/2012 | Fu | H01L 21/31144 438/696 |
| 2013/0059450 | A1 | 3/2013 | Le Gouil et al. | |

* cited by examiner

*Primary Examiner* — Shamim Ahmed

(74) *Attorney, Agent, or Firm* — Rothwell, Figg, Ernst & Manbeck, P.C.

(57) ABSTRACT

Provided is a method of manufacturing a semiconductor device. The method includes providing an object to be processed including a multilayer film formed by alternately laminating a first film and a second film having different dielectric coefficients within a processing container of a plasma processing apparatus; and repeatedly performing a sequence including: supplying a first gas including $O_2$ gas or $N_2$ gas, and a rare gas into the processing container and exciting the first gas, supplying a second gas including a fluorocarbon gas or a fluorohydrocarbon gas into the processing container and exciting the second gas, and supplying a third gas including HBr gas, a fluorine-containing gas, and a fluorocarbon gas or a fluorohydrocarbon gas into the processing container and exciting the third gas, so that the multilayer film is etched through a mask.

14 Claims, 15 Drawing Sheets

MT1

START

PREPARING WORKPIECE ~ST1

EXCITING FOURTH GAS ~ST2

ST3

EXCITING FIRST GAS ~ST11

EXCITING SECOND GAS ~ST12

EXCITING THIRD GAS ~ST13

ST14 DETERMINING WHETHER PREDETERMINED NUMBER OF CYCLES REPEATED

NO

YES

END

METHOD OF MANUFACTURING SEMICONDUCTOR DEVICE

CROSS-REFERENCE TO RELATED APPLICATIONS

This application is based on and claims priority from Japanese Patent Application Nos. 2013-262742 filed on Dec. 19, 2013 with the Japan Patent Office, the disclosure of which is incorporated herein in its entirety by reference.

TECHNICAL FIELD

The present disclosure relates to a method of manufacturing a semiconductor device.

BACKGROUND

As a kind of semiconductor devices, a three-dimensional NAND-type flash memory device has been known. In manufacturing the three-dimensional NAND-type flash memory device, etching is performed on a multilayer film configured by alternately providing two layers having different dielectric constants to form a deep hole in the multilayer film. Such etching is disclosed in U.S. Patent Application Publication No. 2013/0059450.

Specifically, U.S. Patent Application Publication No. 2013/0059450 discloses that an object to be processed ("workpiece") having a mask made of amorphous silicon on a multilayer film is exposed to plasma of a processing gas including $CH_2F_2$ gas, $N_2$ gas, and $NF_3$ gas, thereby etching the multilayer film.

SUMMARY

According to an aspect, the present disclosure provides a method of manufacturing a semiconductor device. The method includes providing an object to be processed including a multilayer film formed by alternately laminating a first film and a second film having different dielectric coefficients within a processing container of a plasma processing apparatus; and repeatedly performing a sequence including: (a) supplying a first gas including $O_2$ gas or $N_2$ gas, and a rare gas into the processing container and exciting the first gas, (b) supplying a second gas including a fluorocarbon gas or a fluorohydrocarbon gas into the processing container and exciting the second gas, and (c) supplying a third gas including HBr gas, a fluorine-containing gas, and a fluorocarbon gas or a fluorohydrocarbon gas into the processing container and exciting the third gas, so that the multilayer film is etched through a mask.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
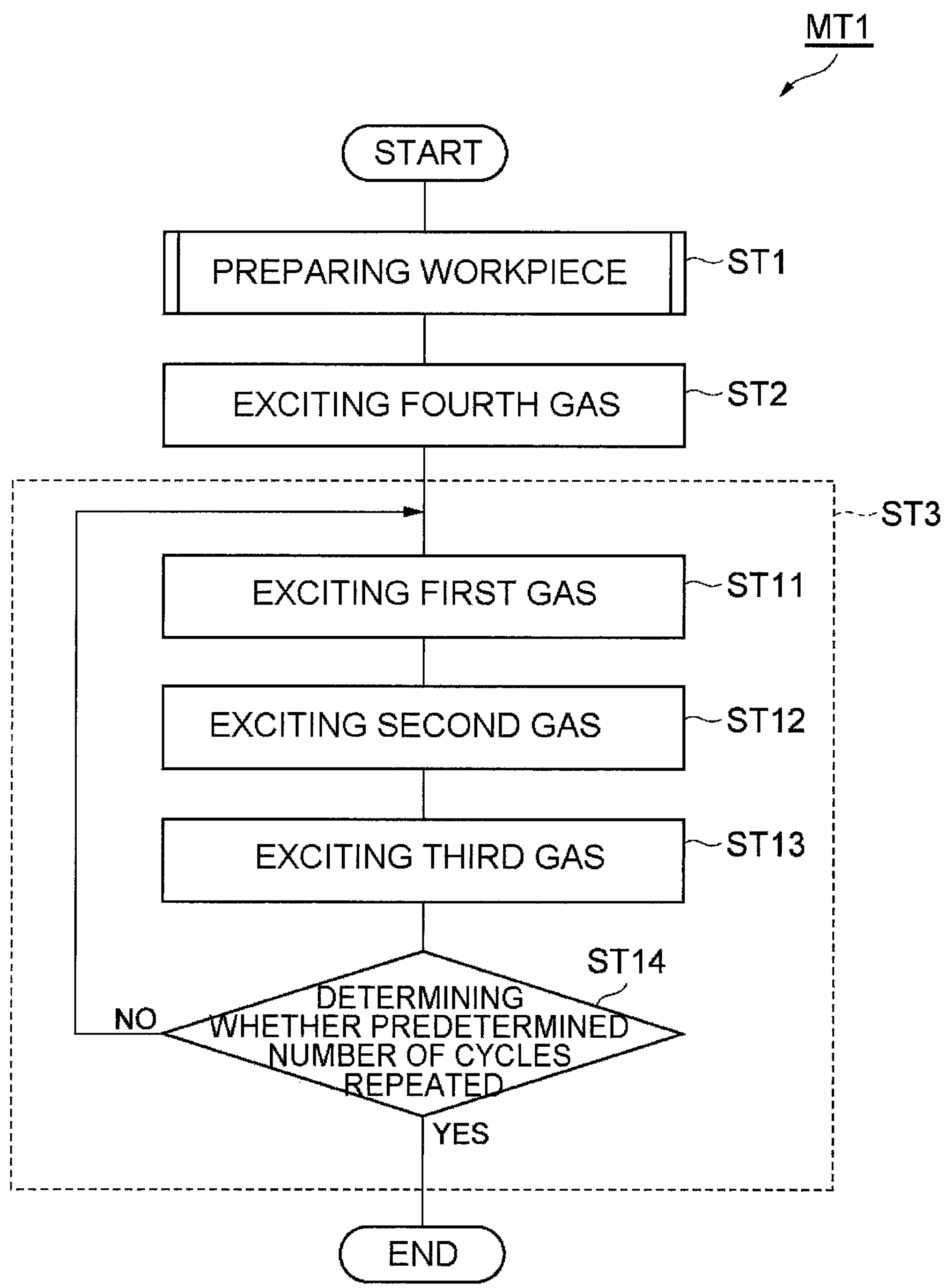
FIG. 1 is a flowchart illustrating a method of manufacturing a semiconductor device according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

It is preferable that a deep space such as a hole formed in a multilayer film have a high verticality. However, in the etching method disclosed in U.S. Patent Application Publication No. 2013/0059450, a side wall surface defining a hole is cut by active species contributing to etching. Thus, a defective feature called bowing occurs particularly in an upper portion of the side wall surface. Further, a reaction product containing carbon derived from $CH_2F_2$ gas is attached to the surface of the mask so that the opening width of the mask is reduced. As a result, as the hole becomes deeper, the diameter of the hole becomes smaller. That is, in the etching method disclosed in U.S. Patent Application Publication No. 2013/0059450, a hole will be formed in a shape tapered in its depth direction.

Accordingly, in the related art, it is required to improve a verticality of a deep space such as a hole formed in a multilayer film.

According to an aspect, the present disclosure provides a method of manufacturing a semiconductor device. The method includes providing an object to be processed including a multilayer film formed by alternately laminating a first film and a second film having different dielectric coefficients within a processing container of a plasma processing apparatus; and repeatedly performing a sequence including: (a) supplying a first gas including $O_2$ gas or $N_2$ gas, and a rare gas into the processing container and exciting the first gas, (b) supplying a second gas including a fluorocarbon gas or a fluorohydrocarbon gas into the processing container and exciting the second gas, and (c) supplying a third gas including HBr gas, a fluorine-containing gas, and a fluorocarbon gas or a fluorohydrocarbon gas into the processing container and exciting the third gas, so that the multilayer film is etched through a mask.

In step (c) of the method, the multilayer film is etched using the third gas including HBr gas, a fluorine-containing gas, and a fluorocarbon gas or a fluorohydrocarbon gas. At this time, a reaction product derived from the third gas is deposited on a surface of the mask and a side wall defining a space. In the method, the reaction product containing carbon deposited on the surface of the mask in step (c) performed in the previous cycle of the sequence is removed in step (a) by active species of $O_2$ gas or $N_2$ gas included in the first gas. Therefore, the reaction product is suppressed from forming an excessive film thickness narrowing an opening width of the mask in the course of etching the multilayer film by repeating the sequence. Thus, since the opening width of the mask is suppressed from being narrowed in step (a), a hole having a shape tapered in a depth direction is suppressed from being formed in step (c) performed thereafter.

Subsequently, in step (b), a reaction product containing carbon derived from the fluorocarbon gas or the fluorohydrocarbon gas is deposited on the surface of the mask at an appropriate film thickness. Further, the reaction product is also deposited on the side wall defining a space. Thus, since the reaction product is deposited on the surface of the mask and the side wall at an appropriate film thickness in step (b), a mask selection ratio is suppressed from being reduced, and bowing is suppressed from occurring on the side wall of the space. Also in step (c), since the multilayer film is etched while the reaction product derived from the third gas is deposited on the side wall of the space, bowing is further suppressed from occurring on the side wall of the space. Therefore, in the above-mentioned method, since the occurrence of bowing on the side wall and the narrowing of the opening width of the mask are suppressed, a space having a high verticality may be formed in the multilayer film.

In an exemplary embodiment, the above-mentioned method may further include, before the repeating of the sequence, etching the multilayer film up to a midway position along a lamination direction by supplying a fourth gas including HBr gas, a fluorine-containing gas, and a fluorocarbon gas or a fluorohydrocarbon gas into the processing container and exciting the fourth gas. The multilayer film may be etched from the midway position in the lamination direction in the repeating of the sequence. The exemplary embodiment may enhance the etching rate of the multilayer film.

In an exemplary embodiment, the fourth gas may further include at least one of $N_2$ gas, $H_2$ gas, and $CH_4$ gas. According to the exemplary embodiment, a deposit containing carbon attached to the mask is removed by an active species of nitrogen, or an active species of hydrogen contained in a gas such as, for example, $H_2$ gas or $CH_4$ gas. Therefore, the opening width of the mask is suppressed from being narrowed by the deposit attached to the mask. In a case where the fourth gas includes $H_2$ gas or $CH_4$ gas, the etching rate of the multilayer film is enhanced by the active species of the hydrogen. Hence, the mask selection ratio may be improved. Further, in a case where the fourth gas includes $CH_4$ gas, a carbon-containing reaction product is deposited on the mask. Hence, the mask selection ratio may be further improved. Further, in an exemplary embodiment, the third gas may further include at least one of $N_2$ gas, $H_2$ gas, and $CH_4$ gas. Further, in an exemplary embodiment, the fluorine-containing gas may be $NF_3$ or $SF_6$.

In an exemplary embodiment, the above-mentioned method may further include, before the repeating of the sequence, depositing a carbon-containing reaction product on the surface of the mask by supplying a fifth gas including HBr gas and a fluorocarbon gas into the processing container and exciting the fifth gas.

For example, the mask (hereinafter, referred to as a "first mask") used when forming a deep hole in the multilayer film is formed by transferring a pattern of another mask (hereinafter, referred to as a "second mask") to the mask layer. In forming the first mask, as an active species of an etchant gas enters below the second mask, etching of the mask layer also proceeds in a transverse direction. Meanwhile, the transverse direction refers to a direction orthogonal to the lamination direction of the multilayer film. Here, it is assumed that openings of the second mask are arranged two-dimensionally on the mask layer along a first direction and a second direction, which are orthogonal to each other, and a disposition pitch of the openings is shorter in the second direction than in the first direction. In this case, a portion positioned between the openings arranged along the second direction in the second mask (hereinafter, referred to as a "second portion") has a width smaller than that of a portion positioned between the openings arranged along the first direction in the second mask (hereinafter, referred to as a "first portion"). Hence, the first mask may be formed in a state where its tip end has disappeared at the bottom side of the second portion by the etching in the transverse direction. In this case, the first mask is formed to have different heights in the first portion and the second portion. When etching the multilayer film using this first mask, the etching rates of etching the multilayer film in the first direction and the second direction become different from each other. Therefore, holes with different widths may be formed depending on the direction.

In the above-mentioned exemplary embodiment, the height of the first mask may be uniformized by exciting the fifth gas including HBr gas and a fluorocarbon gas to deposit the carbon-containing reaction product on the surface of the first mask. When the height of the first mask is uniformized before repeating the sequence, the non-uniformity of the hole width depending on the direction may be suppressed in the step of etching the multilayer film.

In an exemplary embodiment, the fifth gas may further include $BCl_3$ gas. When $BCl_3$ gas is added, the height of the mask may be further uniformized and the opening width of the mask may be adjusted.

In an exemplary embodiment, the depositing may further include applying a bias potential to the multilayer film side such that a power of 2.55 W/$cm^2$ per unit area or more is given to the multilayer film. In the present exemplary embodiment, since a relatively large bias potential is applied to the multilayer film, the reaction product deposited on the mask may be suppressed from becoming excessive. Therefore, clogging of the mask opening may be suppressed.

In an exemplary embodiment, the fluorocarbon gas may be $C_3F_8$ gas, $C_4F_6$ gas, or $C_4F_8$ gas. Further, the fluorohydrocarbon gas is $CH_2F_2$ gas, $CH_3F$ gas, or $CHF_3$ gas.

In an exemplary embodiment, the first film may be a silicon oxide film, and the second film may be a silicon nitride film. Further, in an exemplary embodiment, the first film may be a silicon oxide film, and the second film may be a polysilicon film. In an exemplary embodiment, the first film and the second film may be laminated in total of twenty four layers or more. Furthermore, in an exemplary embodiment, the mask may be made of amorphous carbon.

According to various aspects and embodiments of the present disclosure as described above, the verticality of a deep space such as a hole formed in the multilayer film may be improved.

Hereinafter, various exemplary embodiments of the present disclosure will be described in detail with reference to drawings. Meanwhile, in each drawing, the same or corresponding parts will be denoted by the same reference numerals.

FIG. 1 is a flowchart illustrating a method of manufacturing a semiconductor device according to an exemplary embodiment. Method MT1 illustrated in FIG. 1 may be used when manufacturing, for example, a three-dimensional NAND flash memory, and includes steps ST1 to ST3.

Figure 2:
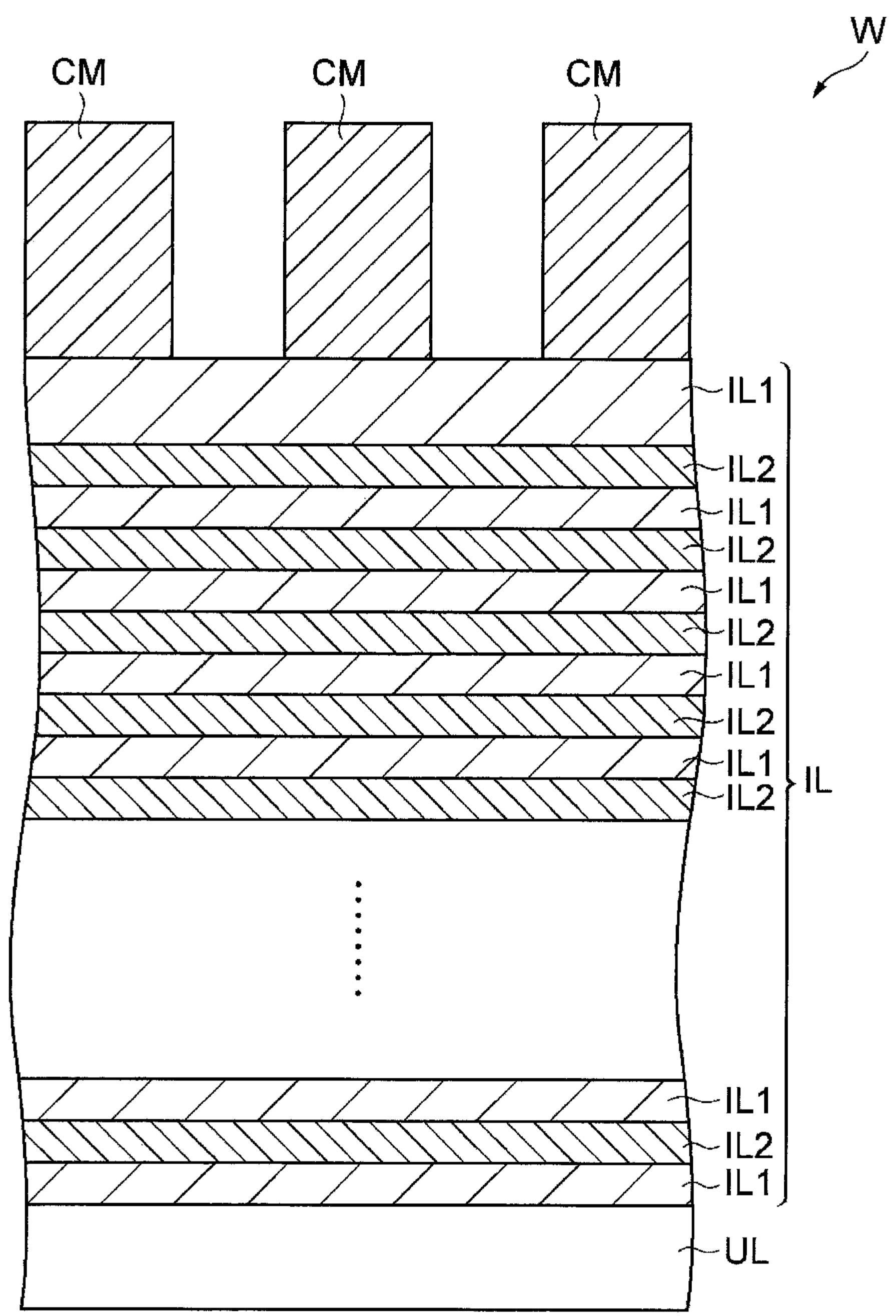
FIG. 2 is a view illustrating an exemplary wafer prepared in step ST1.

Step ST1 is a step of preparing an object to be processed (hereinafter, referred to as a "wafer") W. FIG. 2 is a view illustrating an exemplary wafer W prepared in step ST1. The wafer W illustrated in FIG. 2 includes an underlying layer UL, a multilayer film IL, and a mask CM. The underlying layer UL may be a layer made of polycrystalline silicon, which is formed on a substrate. The multilayer film IL is formed on the underlying layer UL. The multilayer film IL has a structure in which two dielectric films IL1 and IL2 having different dielectric constants are laminated alternately. In an exemplary embodiment, the dielectric film IL1 may be a silicon oxide film, and the dielectric film IL2 may be a silicon nitride film. In another exemplary embodiment, the dielectric film IL1 may be a silicon oxide film, and the dielectric film IL 2 may be a polysilicon film. The thickness of the dielectric film IL1 is, for example, 5 nm to 50 nm, and the thickness of the dielectric film IL2 is, for example, 10 nm to 75 nm. The dielectric films IL1 and IL2 may be laminated in a total of twenty four layers or more. The mask CM is formed on the multilayer film IL. The mask CM has a pattern in order to form deep spaces such as holes in the multilayer film IL. The mask CM may be made of, for example, amorphous carbon.

Figure 3:
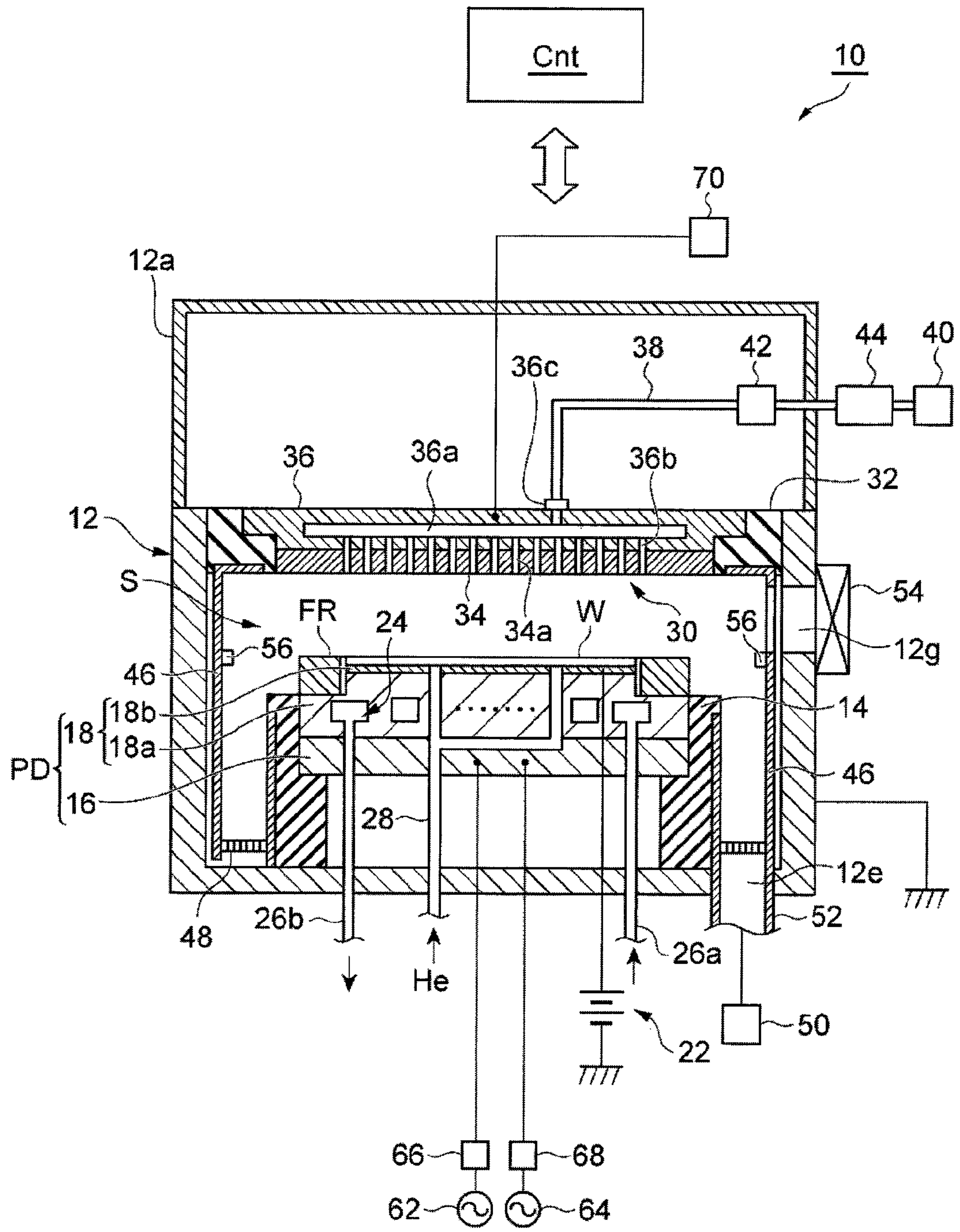
FIG. 3 is a schematic view illustrating an exemplary plasma processing apparatus.

Referring back to FIG. 1, in step ST1 of the method MT1, the wafer W is prepared in a processing container of a plasma processing apparatus. In an example, the plasma processing apparatus may be a capacitively coupled plasma processing apparatus. Hereinafter, descriptions will be made on an exemplary plasma processing apparatus which can be applied to perform the method MT1. FIG. 3 is a schematic view illustrating an exemplary plasma processing apparatus, and shows a structure in a vertical cross-section of the plasma processing apparatus.

The plasma processing apparatus 10 illustrated in FIG. 3 is a capacitively coupled plasma etching apparatus, and is provided with a substantially cylindrical processing container 12. The inner wall of the processing container 12 is made of anodized aluminum. The processing container 12 is grounded for safety.

A substantially cylindrical support 14, which is made of an insulating material, is provided on a bottom of the processing container 12. In the processing container 12, the support 14 extends vertically from the bottom of the processing container 12. The support 14 supports a placing table PD provided in the processing container 12. Specifically, as illustrated in FIG. 3, the support 14 may support the placing table PD on the inner wall thereof.

The placing table PD holds the wafer W on its top surface. The placing table PD may include a lower electrode (an electrode part) 16 and a support part 18. The lower electrode 16 is made of a metal such as, for example, aluminum, and has a substantially disc shape. The support part 18 is provided on the top surface of the lower electrode 16.

The support part 18 supports the wafer W and includes a base 18*a* and an electrostatic chuck 18*b*. The base 18*a* is made of a metal such as, for example, aluminum, and has a substantially disc shape. The base 18*a* is provided on the lower electrode 16 and electrically connected to the lower electrode 16. The electrostatic chuck 18*b* is provided on the base 18*a*. The electrode chuck 18*b* has a configuration in which an electrode, which is a conductive film, is disposed between a pair of insulating layers or insulating sheets. The electrode of the electrostatic chuck 18*b* is electrically connected with a direct current (DC) power source 22. The electrostatic chuck 18*b* may attract and hold the wafer W with electrostatic force such as Coulomb force generated by DC voltage applied from the DC power source 22.

A focus ring FR is disposed on a periphery of the base 18*a* of the support part 18 to surround a periphery of the wafer W and the electrostatic chuck 18*b*. The focus ring FR is provided in order to enhance uniformity of the etching. The focus ring FR is made of a material which is appropriately selected depending on a material of a film to be etched, for example, quartz.

A coolant path 24 is formed inside the base 18*a*. The coolant path 24 constitutes a temperature adjusting mechanism according to an exemplary embodiment. A coolant at a predetermined temperature is circulated and supplied from a chiller unit, which is provided outside, to the coolant path 24 through pipes 26*a*, 26*b*. The temperature of the wafer W supported by the support part 18 is controlled by controlling the temperature of the coolant circulated in this way.

Further, the plasma processing apparatus 10 is formed with a gas supply line 28. The gas supply line 28 supplies a heat transfer gas such as, for example, helium (He) gas, from a heat transfer gas supply mechanism to a gap between the top surface of the electrostatic chuck 18*b* and the rear surface of the wafer W.

Further, the plasma processing apparatus 10 is provided with an upper electrode 30. The upper electrode 30 is disposed above the placing table PD to face the placing table PD. The lower electrode 16 and the upper electrode 30 are provided substantially in parallel to each other. A processing space S is defined between the upper electrode 30 and the lower electrode 16 to perform a plasma processing on the wafer W.

The upper electrode 30 is supported in the upper portion of the processing container 12 through an insulating shielding member 32. The upper electrode 30 may include an electrode plate 34 and an electrode support 36. The electrode support 34 faces the processing space S and defines a plurality of gas ejection holes 34*a*. The electrode plate 34 may be made of a low-resistance conductor or semiconductor having a low joule heat.

The electrode support 36 detachably supports the electrode plate 34, and may be made of a conductive material such as, for example, aluminum. The electrode support 36 may have a water-cooling structure. A gas diffusion chamber 36*a* is formed inside the electrode support 36. A plurality of gas passage holes 36*b* communicating with the gas ejection holes 34*a* extends downwardly from the gas diffusion chamber 36*a*. Further, the electrode support 36 is formed with a gas inlet 36*c* configured to guide a processing gas to the gas diffusion chamber 36*a*. The gas inlet 36*c* is connected with a gas supply pipe 38.

Figure 4:
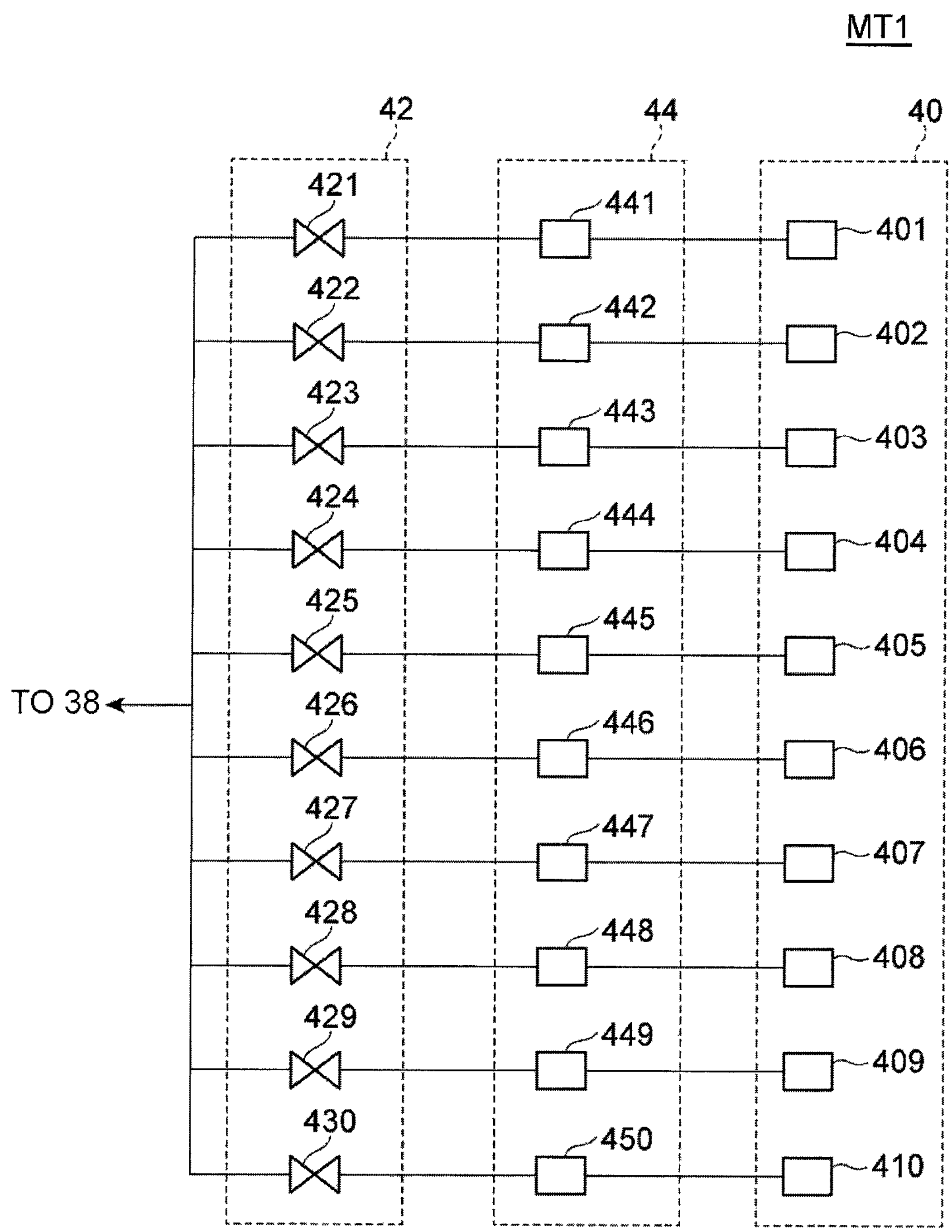
FIG. 4 is a view illustrating a valve group, a flow controller group, and a gas source group illustrated in FIG. 3 in detail.

The gas supply pipe 38 is connected with a gas source group 40 through a valve group 42 and a flow controller group 44. FIG. 4 is a view illustrating in detail the valve group, the flow controller group, and the gas source group as illustrated in FIG. 3. As illustrated in FIG. 4, the gas source group 40 includes a plurality (N) of gas sources 401 to 410. The gas sources 401 to 410 are sources of HBr gas, a fluorine-containing gas, $N_2$ gas, $O_2$ gas, $H_2$ gas, $CH_4$ gas, $BCl_3$ gas, a rare gas, a fluorocarbon gas, and a fluorohydrocarbon gas, respectively. The rare gas is exemplified by Ar gas. Further, the fluorocarbon gas is exemplified by $C_3F_8$ gas, $C_4F_6$ gas, or $C_4F_8$ gas, and the fluorohydrocarbon gas is exemplified by $CH_2F_2$ gas, $CH_3F$ gas, or $CHF_3$ gas. The fluorine-containing gas is exemplified by $NF_3$ gas or $SF_6$ gas.

The flow controller group 44 includes a plurality (N) of flow controllers 441 to 450. Each of the flow controllers 441 to 450 controls a flow rate of a gas supplied from the corresponding gas source. Each of the flow controllers 441 to 450 may be a mass flow controller (MFC) or an FCS. The valve group 42 includes a plurality (N) of valves 421 to 430. The gas sources 401 to 410 are connected to the gas supply pipe 38 through the flow controllers 441 to 450 and valves 421 to 430, respectively. Gases of the gas sources 401 to 410 reach the gas diffusion chamber 36*a* from the gas supply pipe 38, and are ejected to the processing space S through the gas passage holes 36*b* and the gas ejection holes 34*a*.

Referring back to FIG. 3, the plasma processing apparatus 10 may be further provided with a grounding conductor 12*a*. The grounding conductor 12*a* has a substantially cylindrical shape, and is provided to extend above the height position of the upper electrode 30 from the side wall of the processing container 12.

Further, in the plasma processing apparatus 10, a deposit shield 46 is detachably provided along the inner wall of the processing container 12. The deposit shield 46 is also provided on the outer periphery of the support 14. The deposit shield 46 prevents any etching byproduct (deposit) from being attached to the processing container 12, and may be constituted by coating ceramics such as, for example, $Y_2O_3$ on an aluminum material.

At the bottom side of the processing container 12, an exhaust plate 48 is provided between the support 14 and the inner wall of the processing container 12. The exhaust plate 48 may be constituted by coating ceramics such as, for example, $Y_2O_3$ on an aluminum material. The processing container 12 is formed with an exhaust port 12*e* below the exhaust plate 48. The exhaust port 12*e* is connected with an exhaust device 50 through an exhaust pipe 52. The exhaust device 50 is provided with a vacuum pump such as, for example, a turbo molecular pump, and may decompress the inside of the processing container 12 to a desired degree of vacuum. Further, a wafer W carry-in/out port 12*g* is formed through the side wall of the processing container 12, and the carry-in/out port 12*g* is able to be opened or closed by a gate valve 54.

Further, a conductive member (GND block) 56 is provided on the inner wall of the processing container 12. The conductive member 56 is attached to the inner wall of the processing container 12 to be positioned substantially at the same height as the wafer W in the height direction. The conductive member 56 is connected in a DC mode to the ground, and exhibits an effect of preventing abnormal discharge. Meanwhile, the conductive member 56 may be provided in a plasma generating region, and the position thereof is not limited to the position illustrated in FIG. 3.

The plasma processing apparatus 10 is further provided with a first radio frequency power source 62 and a second radio frequency power source 64. The first radio frequency power source 62 generates a first radio frequency (RF) power for plasma generation, and generates a radio frequency power of 27 MHz to 100 MHz, for example, 40 MHz. The first radio frequency power source 62 is connected to the lower electrode 16 through a matcher 66. The matcher 66 is a circuit configured to match an output impedance of the first radio frequency power source 62 and an input impedance of a load side (lower electrode 16 side). Meanwhile, the first radio frequency power source 62 may be connected to the upper electrode 30 through the matcher 66.

The second radio frequency power source 64 generates a second radio frequency power, that is, a radio frequency bias power for drawing electrons into the wafer W, and supplies a radio frequency of 400 kHz to 13.56 MHz, for example, 3 MHz. The second radio frequency power source 64 is connected to the lower electrode 16 through a matcher 68. The matcher 68 is a circuit configured to match an output impedance of the second radio frequency power source 64 and the input impedance of the load side (lower electrode 16 side).

The plasma processing apparatus 10 is further provided with a DC power source unit 70. The DC power source unit 70 is connected to the upper electrode 30. The DC power source unit 70 may generate a negative DC voltage and apply the negative DC voltage to the upper electrode 30.

Further, in an exemplary embodiment, the plasma processing apparatus 10 may be further provided with a control unit Cnt. The control unit Cnt is a computer provided with, for example, a processor, a storage unit, an input device, and a display device, and controls each component of the plasma processing apparatus 10. In the control unit Cnt, an operator may use the input device to perform an input operation of commands in order to manage the plasma processing apparatus 10, and to cause the display device to visualize and display the operation status of the plasma processing apparatus 10. Further, the storage unit of the control unit Cnt stores a control program for controlling various processings performed in the plasma processing apparatus 10 by the processor, or a program for allowing each unit of the plasma processing apparatus 10 to perform a processing according to processing conditions, that is, a processing recipe.

Specifically, the control unit Cnt transmits a control signal to the flow controllers 441 to 450, valves 421 to 430, and the exhaust device 50 such that a processing gas is supplied to the processing container 12 during the etching in step ST2 and step ST3, and the pressure in the processing container 12 becomes a set pressure.

Further, in an exemplary embodiment, the control unit Cnt may transmit a control signal to the first radio frequency power source 62 such that the radio frequency power from the first radio frequency power source 62 is supplied to the lower electrode 16 while ON and OFF of the radio frequency power are switched in a pulse form. Further, the control unit Cnt may transmit a control signal to the DC power source unit 70 such that a negative DC voltage having an absolute value larger than that in a period where the radio frequency power is turned ON is applied to the upper electrode 30 during a period where the radio frequency power is turned OFF. Meanwhile, a frequency of ON and OFF of the radio frequency power of the first radio frequency power source 62 is, for example, 1 kHz to 90 kHz. Here, the frequency of ON and OFF of the radio frequency power refers to a frequency having one cycle including the period where the first radio frequency power of the first radio frequency power source 62 is ON and the period where the first radio frequency power is OFF. Further, a duty ratio occupied by the period where the radio frequency power is ON is, for example, 50% to 90% in one cycle. Further, the switching of a DC voltage value of the DC power source unit may be synchronized with the conversion of ON and OFF of the radio frequency power of the first radio frequency power source 62.

Referring back to FIG. 1, the descriptions of method MT1 will be continued. In step ST1, the wafer W placed on the placing table PD is attracted and held by the electrostatic chuck 18*b*. Subsequently, step ST2 is performed in method MT1.

In step ST2, a fourth gas is excited in the processing container 12 so that the multilayer film IL is etched up to a midway position along a lamination direction of the multilayer film IL. Therefore, the fourth gas is supplied from the gas source group 40 into the processing container 12 such that the pressure in the processing container 12 is set to a predetermined pressure. The fourth gas includes HBr gas, a fluorine-containing gas, and a fluorocarbon gas or a fluorohydrocarbon gas. The fourth gas may include, for example, $NF_3$ gas or $SF_6$ gas as the fluorine-containing gas. Further, at least one of $C_3F_8$ gas, $C_4F_6$ gas, and $C_4F_8$ gas, for example, may be used as the fluorocarbon gas. At least one of $CH_2F_2$ gas, $CH_3F$ gas, and $CHF_3$ gas, for example, may be used as the fluorohydrocarbon gas. In an exemplary embodiment, the fourth gas may further include at least one of $N_2$ gas, $H_2$ gas, and $CH_4$ gas. For example, the fourth gas may include HBr gas, $SF_6$ gas, $C_4F_8$ gas, $N_2$ gas, $H_2$ gas, and $CH_4$ gas. Further, in step ST2, the radio frequency powers from the first radio frequency power source 62 and the second radio frequency power source 64 are applied to the lower electrode 16.

Figure 5:
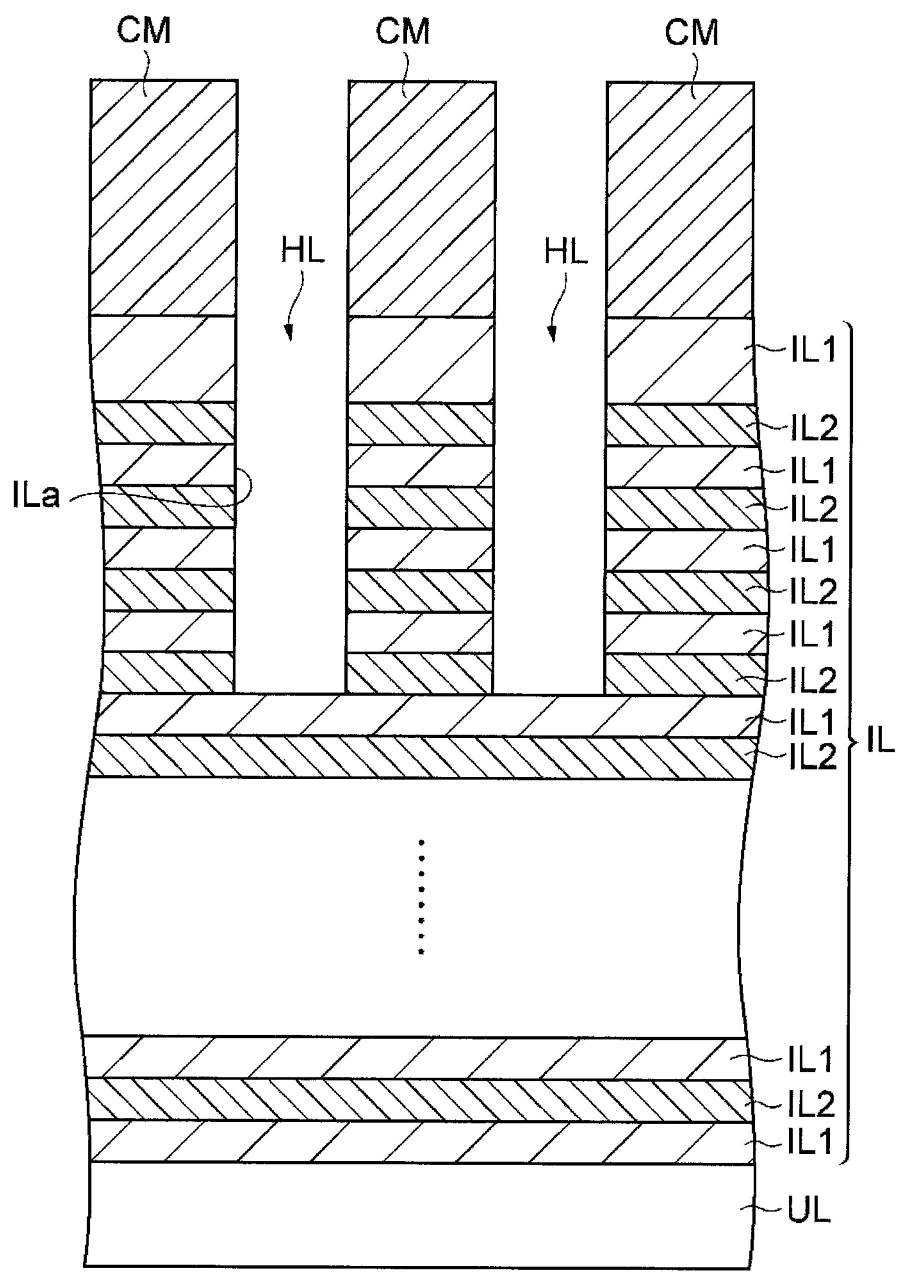
FIG. 5 is a view illustrating a wafer etched in step ST2.

In step ST2, plasma of the fourth gas is generated in the processing container 12. That is, active species of fluorine, active species of hydrogen, and active species of bromine are generated. As illustrated in FIG. 5, the multilayer film IL is etched below the openings of the mask CM by these active species. Accordingly, holes HL are formed in the multilayer film IL. When the multilayer film IL is etched, a deposit derived from the fourth gas is formed on the side wall surfaces ILa defining the holes HL. Therefore, the side wall surfaces ILa are suppressed from being etched laterally, and hence, bowing is suppressed from occurring on the side wall surfaces ILa. A relatively large number of active species of hydrogen is included in the fourth gas. Therefore, when the dielectric film IL2 is a silicon nitride film, the etching ratio of the dielectric film IL2 increases. As a result, the etching ratio of the multilayer film IL increases.

Further, in step ST2, a protective film containing carbon included in the processing gas is attached to the surface of the mask CM. In step ST2, a mask selection ratio may be improved by the protective film. Further, in step ST2, since a part of the protective film may be removed by the active species of nitrogen and hydrogen, the protective film is suppressed from being deposited excessively on the surface of the mask CM. Therefore, the opening width of the mask is suppressed from being narrowed by the protective film.

Subsequently, step ST3 is performed in method MT1. In step ST3, the multilayer film IL is etched from a position where the etching is terminated in step ST2, that is, the midway position in the lamination direction of the multilayer film IL as a starting point. Step ST3 includes steps ST11 to ST14. In step ST3, a sequence including steps ST11 to ST13 is performed repeatedly.

In step ST11, a first gas including $O_2$ gas or $N_2$ gas, and a rare gas is excited. Therefore, the first gas is supplied from the gas source group 40 into the processing container 12 such that the pressure in the processing container 12 is set to a predetermined pressure. The first gas may include, for example, Ar gas as the rare gas. Further, in step ST11, the radio frequency powers from the first radio frequency power source 62 and the second radio frequency power source 64 are applied to the lower electrode 16.

Figure 6:
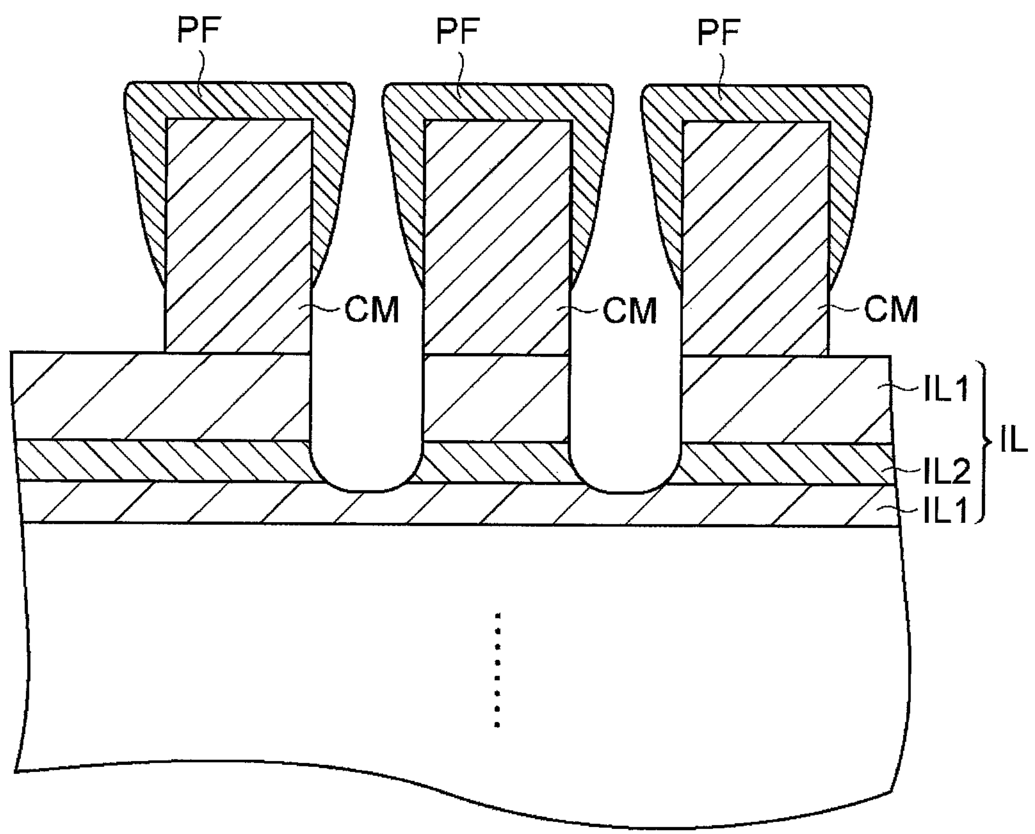
FIG. 6 is a view illustrating a protective film attached to a surface of a mask.

In step ST11, plasma of the first gas is generated in the processing container 12. That is, active species of oxygen or nitrogen are generated in the processing container 12. Immediately after the multilayer film IL is etched up to the midway position in the lamination direction in step ST2, a protective film PF having a relatively large film thickness may be attached to the surface of the mask CM as illustrated in FIG. 6. The protective film PF having a large film thickness may cause narrowing the opening width of the mask CM. In step ST11, the protective film PF is removed by the active species of oxygen or nitrogen. Therefore, the opening width of the mask CM is suppressed from being narrowed.

Subsequently, step ST12 is performed. In step ST12, a second gas including a fluorocarbon gas or a fluorohydrocarbon gas is excited. Therefore, the second gas is supplied from the gas source group 40 into the processing container 12 such that the pressure in the processing container 12 is set to a predetermined pressure. The second gas may include, for example, at least one of $C_3F_8$ gas, $C_4F_6$ gas, and $C_4F_8$ gas as the fluorocarbon gas, or at least one of $CH_2F_2$ gas, $CH_3F$ gas, and $CHF_3$ gas as the fluorohydrocarbon gas. For example, the second gas may include $C_4F_8$ gas and Ar gas.

Figure 7:
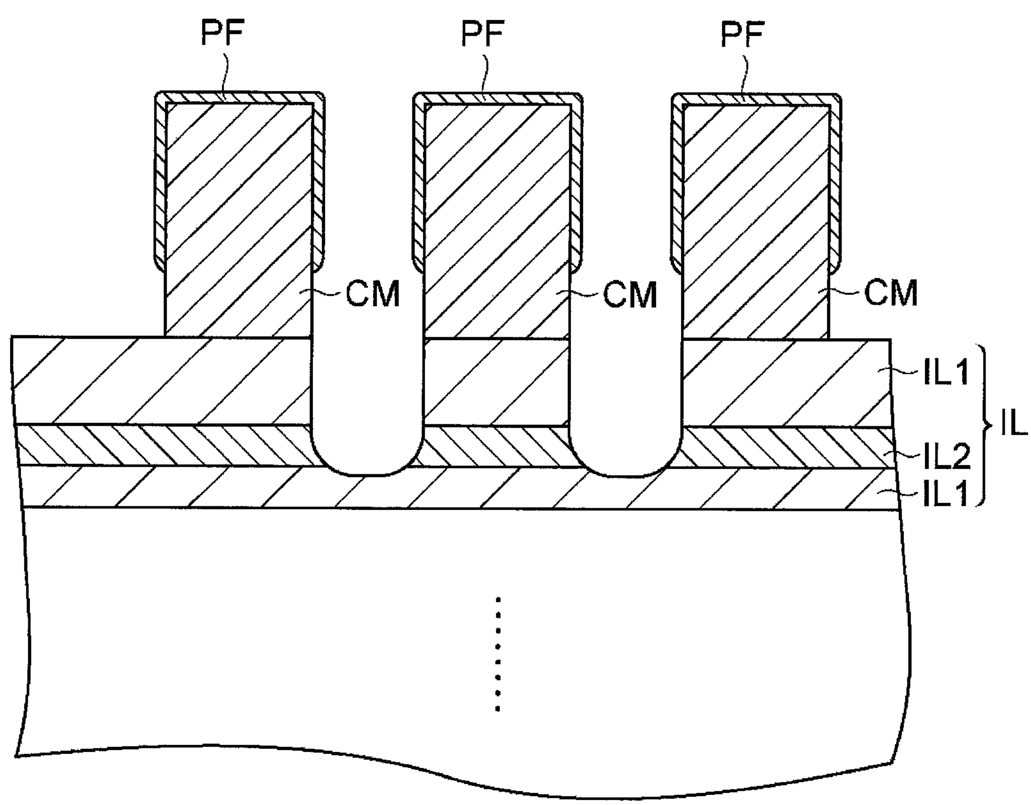
FIG. 7 is a view illustrating a protective film attached to a surface of a mask.

In step ST12, plasma of the second gas is generated in the processing container 12. As a result, as illustrated in FIG. 7, the protective film PF containing carbon derived from the fluorocarbon gas or the fluorohydrocarbon gas is formed again on the surface of the mask CM at an appropriate film thickness. The selection ratio of the mask CM may be enhanced by the protective film PF.

In the subsequent step ST13, a third gas is excited. Therefore, the third gas is supplied from the gas source group 40 into the processing container 12 such that the pressure in the processing container 12 is set to a predetermined pressure. The third gas includes HBr gas, a fluorine-containing gas, and a fluorocarbon gas or a fluorohydrocarbon gas. The third gas may include, for example, $NF_3$ gas or $SF_6$ gas as the fluorine-containing gas. Further, at least one of $C_3F_8$ gas, $C_4F_6$ gas, and $C_4F_8$ gas, for example, may be used as the fluorocarbon gas. At least one of $CH_2F_2$ gas, $CH_3F$ gas, and $CHF_3$ gas, for example, may be used as the fluorohydrocarbon gas. In an exemplary embodiment, the third gas may further include at least one of $N_2$ gas, $H_2$ gas, and $CH_4$ gas. In step ST13, the radio frequency powers from the first radio frequency power source 62 and the second radio frequency power source 64 are applied to the lower electrode 16.

In step ST13, plasma of the third gas is generated in the processing container 12. That is, active species of fluorine, active species of hydrogen, and active species of bromine are generated. The multilayer film IL is etched from the midway position in the lamination direction below the opening of the mask CM by these active species. When the multilayer film IL is etched, a deposit derived from the third gas is formed on the side wall surfaces ILa defining the holes HL. Therefore, the side wall surfaces ILa are suppressed from being etched laterally, and hence, bowing is suppressed from occurring on the side wall surfaces ILa. Further, since the protective film PF having an excessive film thickness is removed in step ST11, the opening width of the mask CM is secured sufficiently. Accordingly, in step 13, decrease in diameter of the holes formed in the multilayer film IL is suppressed. Furthermore, since the protective film PF having a proper film thickness is formed again on the surface of the mask CM in step ST12, the selection ratio of the mask CM is secured in step ST13.

Figure 8:
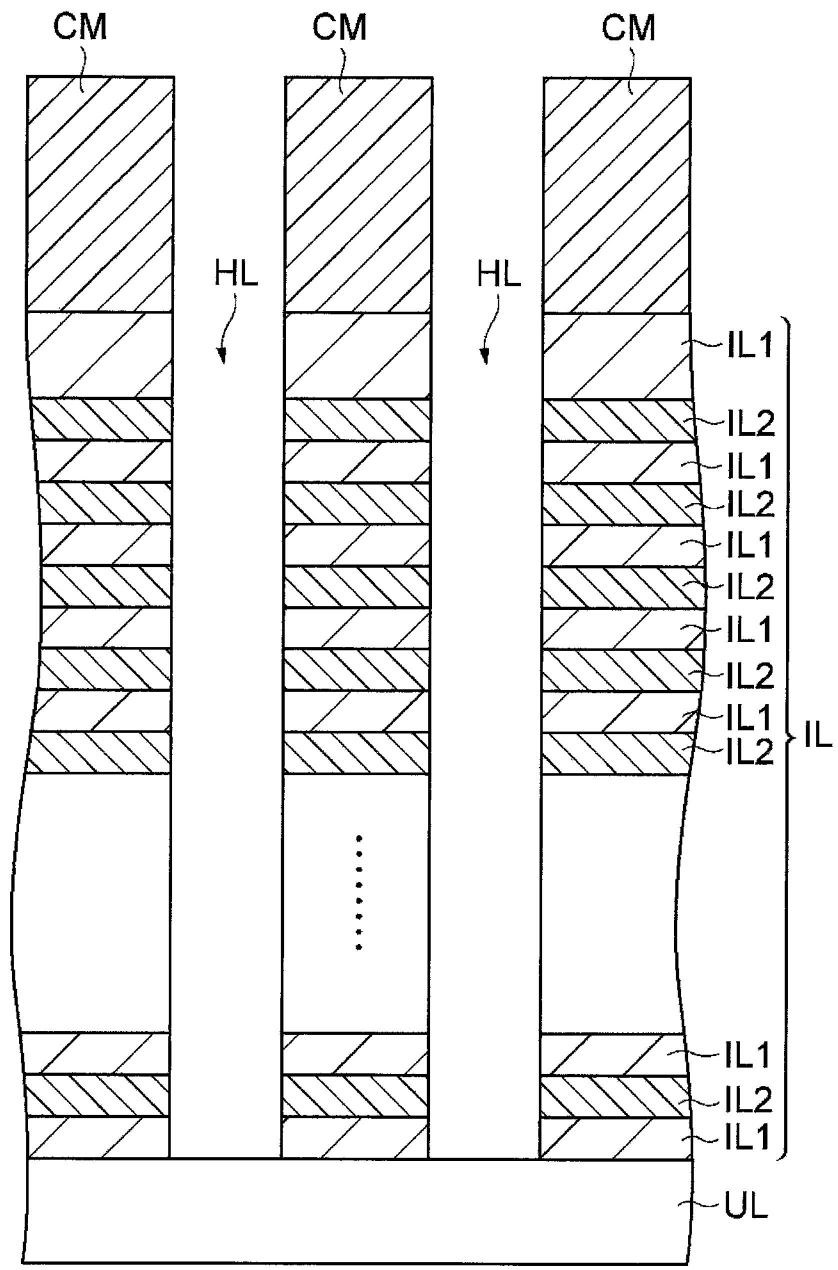
FIG. 8 is a view illustrating a wafer etched in step ST3.

Subsequently, in step ST14, it is determined whether steps ST11 to ST13 have been repeated by a predetermined number of cycles. When it is determined in step ST14 that the steps ST11 to ST13 have been repeated by the predetermined number of cycles, method MT1 is terminated. Meanwhile, when it is determined in step ST14 that the steps ST11 to ST13 have not been repeated by the predetermined number of cycles, method MT1 proceeds with step ST11. As step ST11, step ST12, and step ST13 are performed repeatedly in step ST3 in this manner, the portions positioned below the openings of the mask CM of the multilayer film IL are etched up to the surface of the underlying layer UL, as illustrated in FIG. 8.

In an exemplary embodiment, in steps ST2 and ST11 to ST13, ON and OFF of the radio frequency power of the first radio frequency power source 62 may be switched in a pulse form. Further, as described above, the large and small absolute values of the negative DC voltage applied to the upper electrode 30 may be switched in synchronization with the switching of ON and OFF of the radio frequency power of the first radio frequency power source 62. In this aspect, when the radio frequency power is ON, plasma is generated. And, when the radio frequency power is OFF, the plasma just above the wafer W dissipates. Further, when the radio frequency power is OFF, positive ions are drawn into the upper electrode 30 to collide with each other by the negative DC voltage applied to the upper electrode 30. Accordingly, secondary electrons are emitted from the upper electrode 30. The emitted secondary electrons modify the mask CM so that the etching resistance of the mask CM is enhanced. Further, the secondary electrons neutralize the charged state of the wafer W, so that a straightness of ions into the holes formed in the multilayer film IL is improved during the etching of the multilayer film IL.

Meanwhile, in steps ST2 and ST11 to ST13, for example, a radio frequency power, in which the frequency of ON and OFF of the radio frequency power is 1 kHz to 40 kHz, and the duty ratio occupied by the period where the radio frequency power is ON is 50% to 90% in one cycle, may be given to the lower electrode 16 from the first radio frequency power source 62.

In the exemplary embodiment as illustrated in FIG. 1, the multilayer film IL is etched up to a midway position in the lamination direction of the multilayer film IL in step ST2, and then, the multilayer film IL is etched from the midway position in the lamination direction of the multilayer film IL as a starting point in step ST3. However, step ST2 may not be necessarily performed. That is, in an exemplary embodiment, the multilayer film IL may be etched from the surface of the multilayer film IL to the surface of the underlying layer UL by performing steps ST11 to ST13 repeatedly on a workpiece prepared in step ST1. In this case, holes HL having an improved verticality may be formed, as compared with the exemplary embodiment as illustrated in FIG. 1. Further, in step ST3, steps ST11 to ST13 may be performed in any order.

Figure 9:
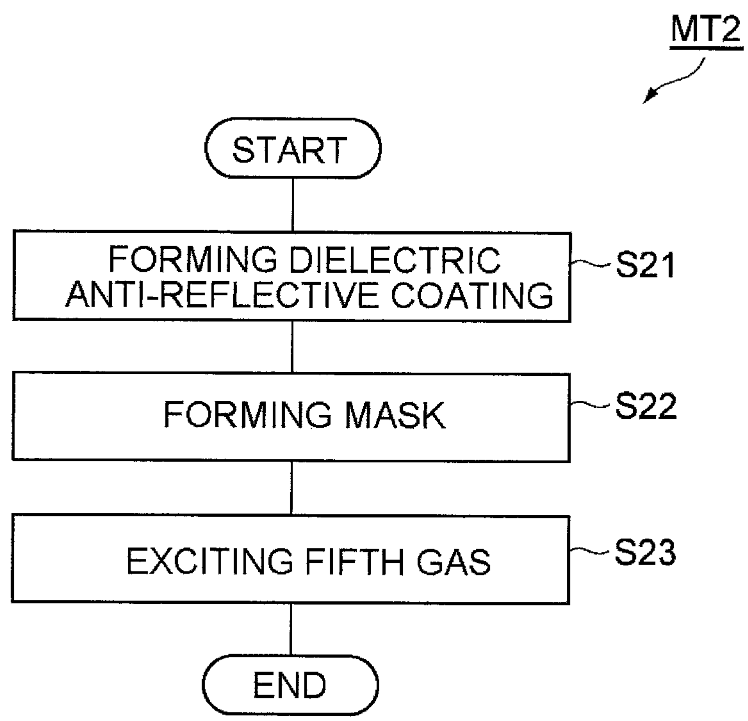
FIG. 9 is a flowchart illustrating a method of forming a mask.

Subsequently, a method of forming a mask CM in the wafer W prepared in step ST1 will be described in detail. FIG. 9 is a flowchart illustrating a method of forming a mask CM according to an exemplary embodiment. Method MT2 illustrated in FIG. 9 is a method of patterning the mask CM, and includes steps ST21 to ST23.

Figure 10C:
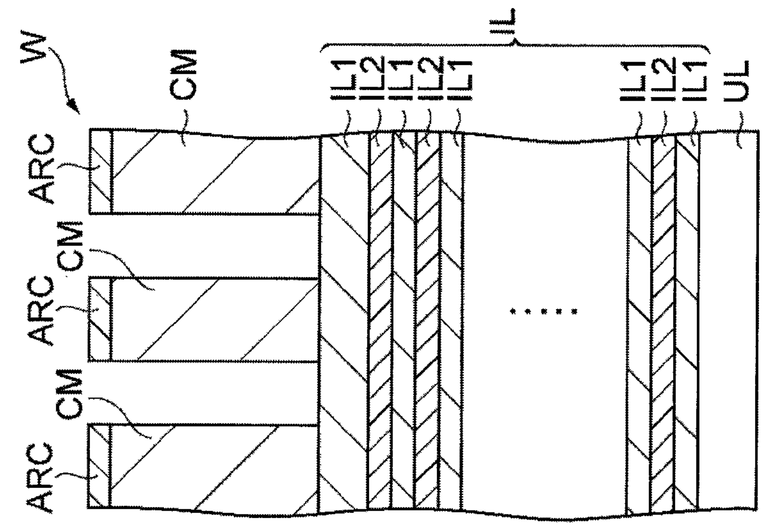
FIGS. 10A to 10C are views illustrating a wafer formed with a mask by the method illustrated in FIG. 9.

First, descriptions will be made on a wafer W on which a mask CM is to be formed with reference to FIG. 10A. The wafer W illustrated in FIG. 10A includes an underlying layer UL, a multilayer film IL, and a mask layer ML. The mask layer ML is formed on the multilayer film IL. The mask layer ML may be made of amorphous carbon.

Figure 10B:
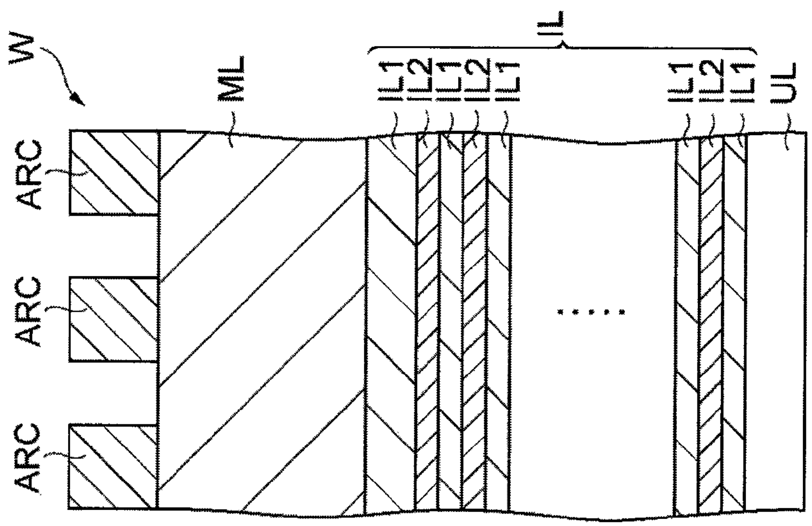
Figure 10A:
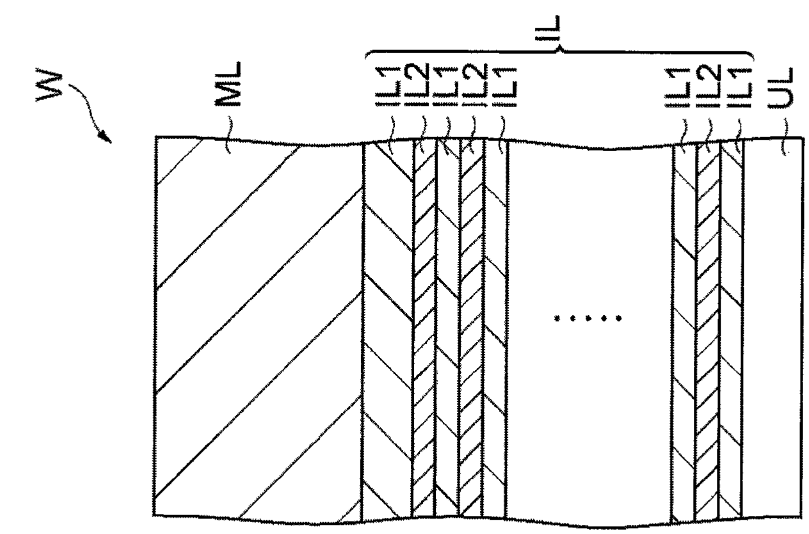

In step ST21, a dielectric anti-reflective coating (DARC) ARC patterned in a predetermined shape is formed on the mask ML as illustrated in FIG. 10B. The dielectric anti-reflective coating ARC may be patterned in a predetermined shape by etching through, for example, a resist mask.

Then, the mask CM is formed in step ST22. The mask CM is formed by etching the mask layer ML using the dielectric anti-reflective coating ARC as a mask. The etching of the mask layer ML is performed by generating plasma of, for example, a processing gas for the mask layer ML. Thus, the pattern of the dielectric anti-reflective coating ARC is transferred to the mask layer ML so that the mask CM is formed as illustrated in FIG. 10C. In an exemplary embodiment, after the mask CM is formed, the dielectric anti-reflective coating ARC may be removed from the wafer W by a plasma processing.

Figure 11:
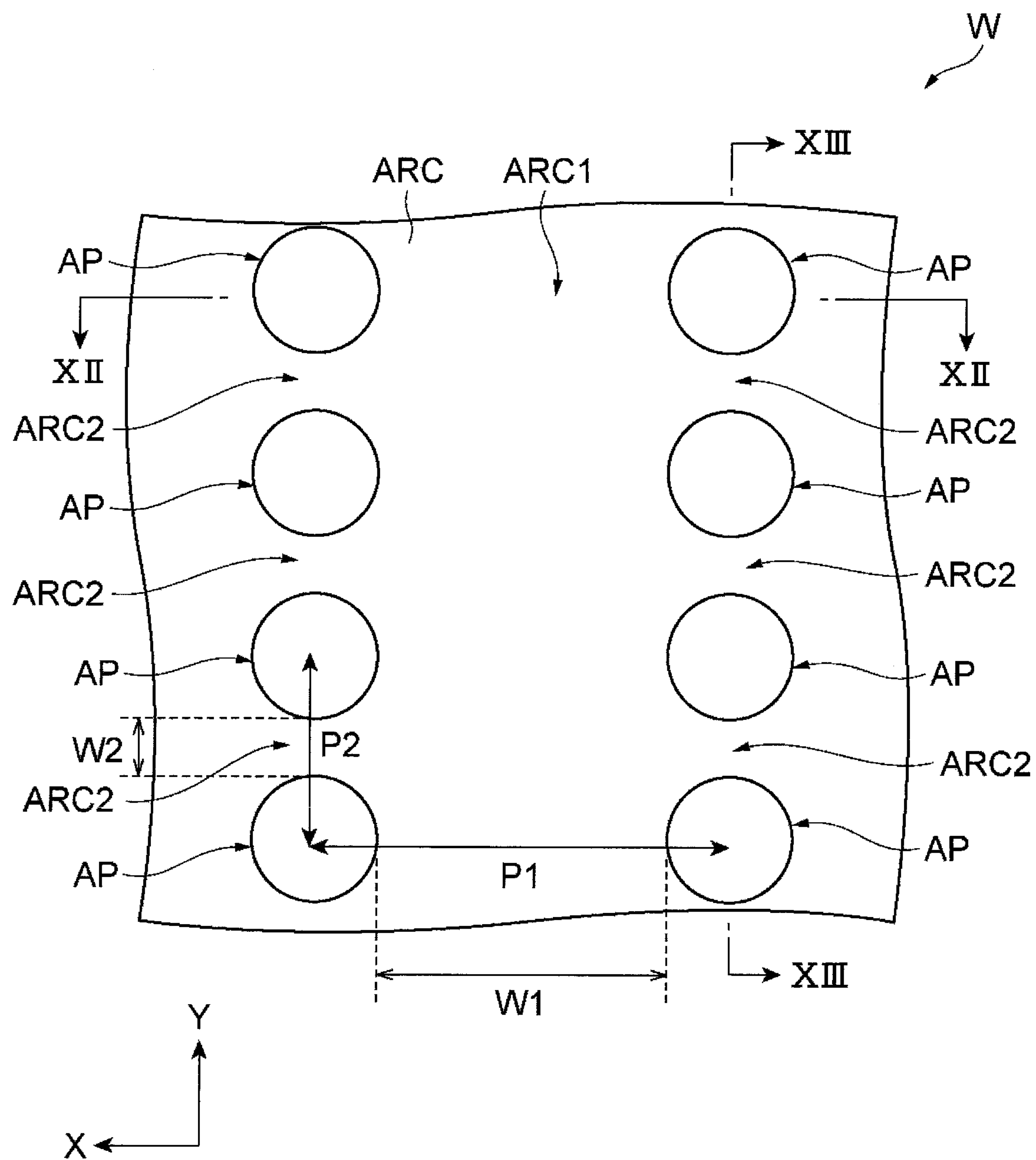
FIG. 11 is a plan view illustrating an exemplary wafer in which a dielectric anti-reflective coating is patterned in a predetermined shape on a mask layer.

Here, descriptions will be made on problems when the mask CM is formed, with reference to FIG. 11. FIG. 11 is a plan view illustrating an exemplary wafer W in which a dielectric anti-reflective coating ARC is patterned in a predetermined shape on a mask layer ML. In the wafer W illustrated in FIG. 11, openings AP of the dielectric anti-reflective coating ARC are arranged on the mask layer ML along an X direction and a Y direction which are orthogonal to each other. Each planar shape of the openings AP is circular. The openings AP are arranged at an arrangement pitch P1 in the X direction, and each two openings adjacent in the X direction are spaced apart from each other with a first portion ARC1 of the dielectric anti-reflective coating ARC being interposed therebetween. That is, the first portions ARC1 are portions of the dielectric anti-reflective coating ARC which are positioned between the openings AP arranged along the X direction, and comparts the openings AP at the X direction side. Further, the openings AP are arranged at an arrangement pitch P2 in the Y direction smaller than the arrangement pitch P1, and each two openings AP adjacent in the Y direction are spaced apart from each other with a second portion ARC2 of the dielectric anti-reflective coating ARC being interposed therebetween. That is, the second portions ARC2 are portions of the dielectric anti-reflective coating ARC which are positioned between the openings AP arranged along the Y direction, and comparts the openings AP at the Y direction side. Therefore, in the wafer W illustrated in FIG. 11, the dielectric anti-reflective coating ARC is patterned such that the width W2 of the second portions ARC2 in the Y direction is smaller than the width W1 of the first portions ARC1 in the X direction.

Figure 12:
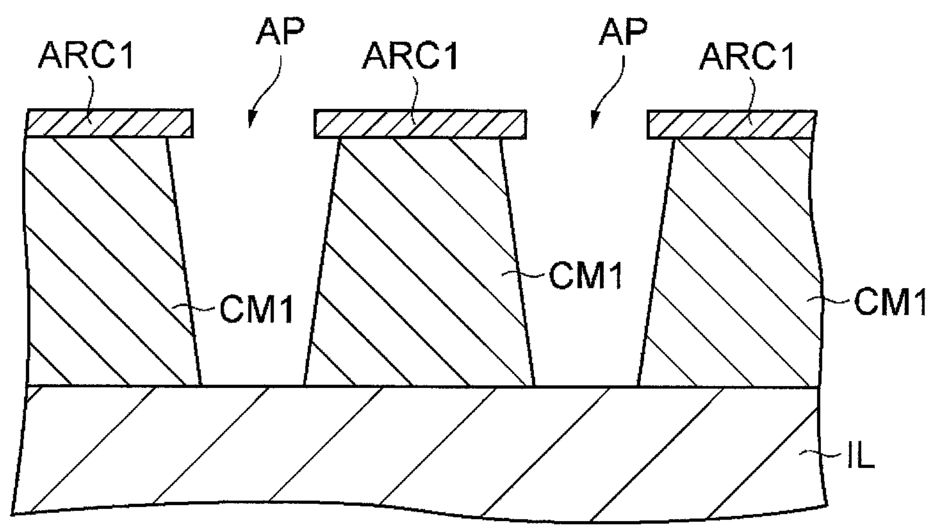
FIG. 12 is a cross-sectional view taken along line XII-XII in FIG. 11 after the mask layer is etched.
Figure 13:
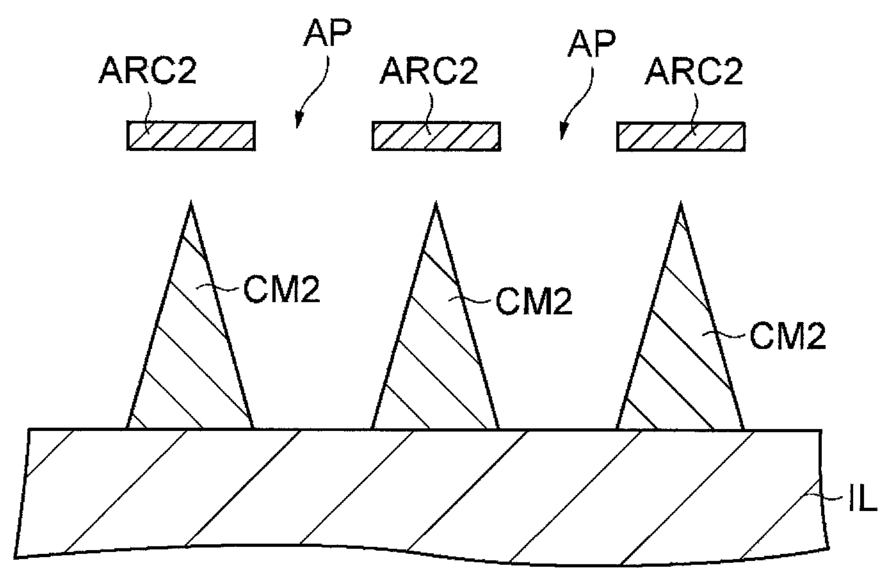
FIG. 13 is a cross-sectional view taken along line XIII-XIII in FIG. 11 after the mask layer is etched.

A case where the mask CM is formed by etching the mask layer ML through step ST22 illustrated in FIG. 9 using the dielectric anti-reflective coating patterned as illustrated in FIG. 11 will be discussed. FIG. 12 is a cross-sectional view taken along line XII-XII of the wafer W illustrated in FIG. 11 after the mask layer ML is etched, and FIG. 13 is a cross-sectional view taken along line XIII-XIII of the wafer W illustrated in FIG. 11 after the mask layer ML of the wafer W illustrated in FIG. 11 is etched. During the etching of the mask layer ML, the active species of the processing gas also flow to and enter below the dielectric anti-reflective coating ARC. Therefore, in the mask layer ML positioned below the dielectric anti-reflective coating ARC, the etching also proceeds transversely. The etching amount in the transverse direction particularly increases in an upper portion of the mask layer ML. As a result, first portions CM1 of the mask CM formed below the first portions ARC1 are shaped such that the width thereof is narrowed from the surface of the multilayer film IL towards the tip end side (the dielectric anti-reflective coating ARC side), as illustrated in FIG. 12.

Further, in second portions CM2 of the mask CM formed below the second portions ARC2, the etching proceeds transversely in the upper portion thereof. At this time, since the width W2 of the second portions ARC2 in the Y direction is small, the tip ends of the second portions CM2 may disappear as illustrated in FIG. 13 in step ST22. In this case, the height of the second portions CM2 with reference to the surface of the multilayer film IL becomes lower than the height of the first portions CM1 with reference to the surface of the multilayer film IL. As a result, the mask CM may be formed to have different heights from portion to portion. That is, a step may occur in the mask CM formed in step ST22. Meanwhile, such a problem becomes more remarkable as the aspect ratio of them mask CM increases.

Figure 14:
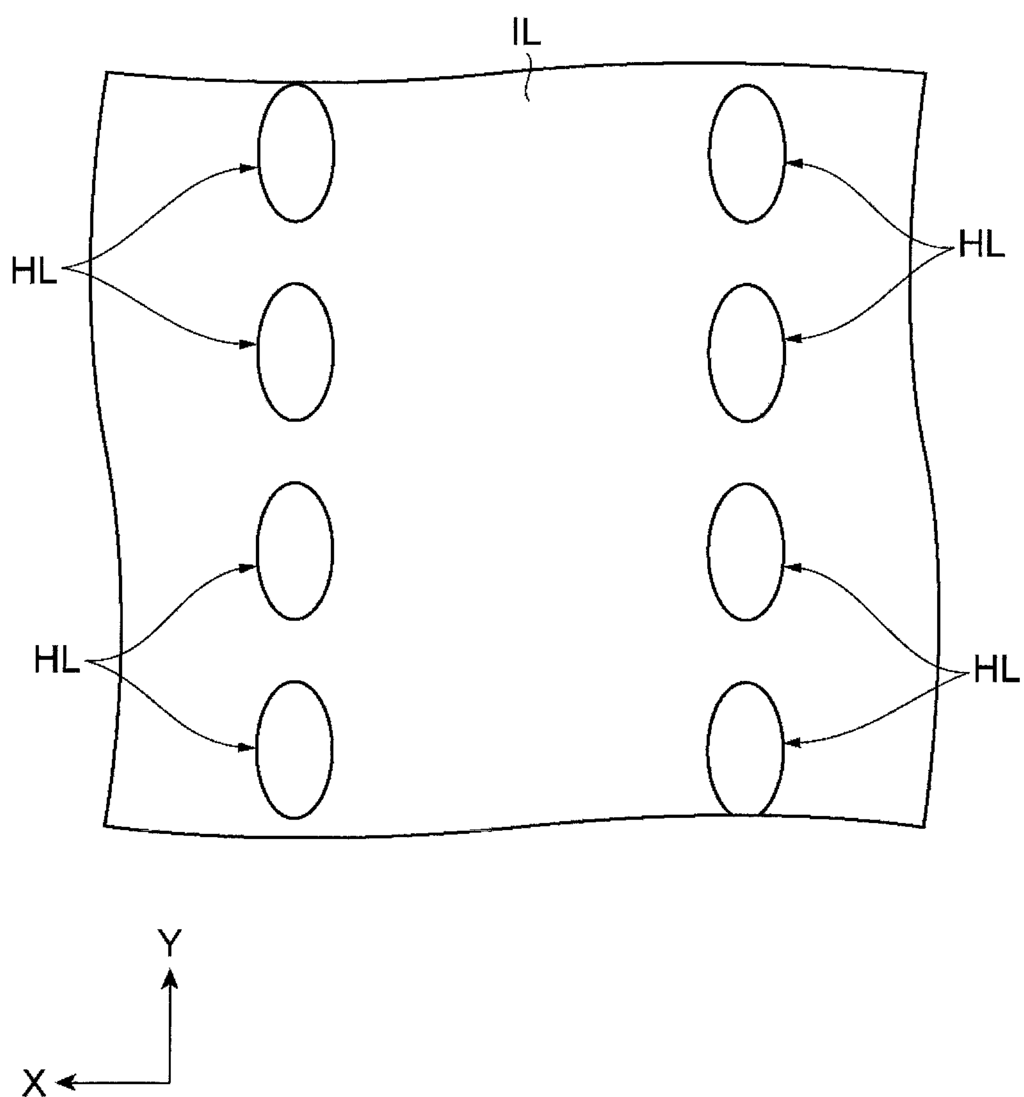
FIG. 14 is a plan view illustrating a multilayer film formed with holes.

When the multilayer film IL is etched by the method MT1 using the mask CM having such a step, the amount of the active species entering the openings of the mask CM is different depending on the directions. Therefore, the etching of the multilayer film IL proceeds at different rates depending on the directions. Specifically, the etching of the multilayer film IL proceeds more rapidly in the Y direction than in the X direction. Thus, holes HL having an oval cross-sectional shape in which the width is larger in the X direction than in the Y direction, may be formed in the multilayer film as illustrated in FIG. 14.

Referring back to FIG. 9, in step ST23, the wafer W formed with the mask CM is conveyed to the processing container 12 of the plasma processing apparatus 10 as illustrated in FIG. 3 and a fifth gas is excited in the processing container 12. The fifth gas includes HBr gas and a fluorocarbon gas. In the fifth gas, at least one of $C_3F_8$ gas, $C_4F_6$ gas, and $C_4F_8$ gas, for example, may be used as the fluorocarbon gas. In an exemplary embodiment, the fifth gas may further include $BCl_3$ gas. For example, the fifth gas may include HBr gas, $C_4F_8$ gas, Ar gas, and $BCl_3$ gas.

Figure 15:
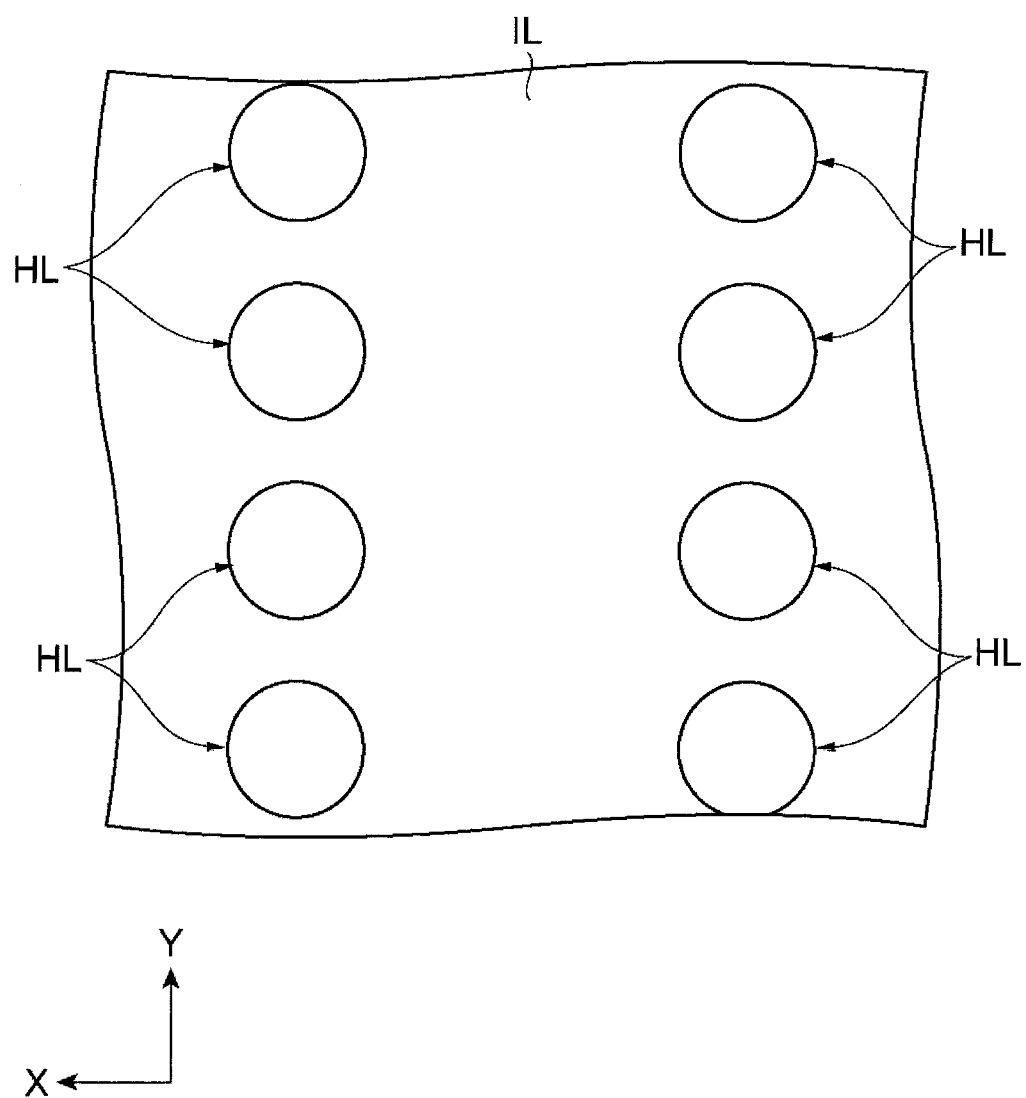
FIG. 15 is a plan view illustrating a multilayer film formed with holes.

In step ST23, a carbon-containing reaction product is deposited on the surface of the mask CM by exciting the fifth gas. The reaction product tends to be deposited selectively on the second portions CM2 which is lower than the first portions CM1 of the mask CM. Thus, the step between the first portion CM1 and the second portions CM2 of the mask CM may be reduced by step ST23. Therefore, the difference between the etching rates in the X direction and the Y direction may be reduced by etching the multilayer film IL using the mask CM in which the step is reduced. As a result, holes in which non-uniformity in width depending on the directions is suppressed may be formed in the multilayer film IL, as illustrated in FIG. 15. Meanwhile, when $BCl_3$ gas is added to the fifth gas, the height of the mask may be more uniformized, and the opening width of the mask CM may be adjusted. Specifically, when $BCl_3$ gas is added, the opening width of the mask CM is reduced such that the diameter of the holes HL formed in the multilayer film IL is reduced.

In step ST23, in order to suppress clogging of the openings of the mask CM, a flow rate ratio represented by "a flow rate of HBr gas/a flow rate of $C_4F_8$ gas" may be set to be larger than 500/100. Further, in step ST23, the radio frequency powers from the first radio frequency power source 62 and the second radio frequency power source 64 are applied to the lower electrode 16. For example, the second radio frequency power source 64 may apply a bias potential to the lower electrode 16 such that a power of 2.55 W/$cm^2$ or more per unit area is given to the multilayer film IL. For example, in a case where the wafer W has a radius of 300 mm, the second radio frequency power source 64 may apply a bias power of 1,800 W or more to the lower electrode 16 in step ST23. Clogging of the openings of the mask CM may be suppressed by applying such a relatively high bias potential.

Further, in an exemplary embodiment, ON and OFF of the radio frequency of the first radio frequency power source 62 may be switched in a pulse form. Further, as described above, the large and small absolute values of the negative DC voltage applied to the upper electrode 30 may be switched in synchronization with the switching of ON and OFF of the radio frequency power of the first radio frequency power source 62. Meanwhile, in step ST23, for example, a radio frequency power, in which the frequency of ON and OFF of the radio frequency power is 1 kHz to 40 kHz, and the duty ratio occupied by the period where the radio frequency power is ON is 50% to 90% in one cycle, may be given to the lower electrode 16 from the first radio frequency power source 62.

Exemplary embodiments have been described, but various modifications may be made without being limited to the above-described exemplary embodiments. For example, the plasma processing apparatus is not limited to a capacitively coupled plasma processing apparatus, but may be an inductively coupled plasma processing apparatus, or a plasma processing apparatus which introduce microwaves into a processing container through a waveguide and an antenna to generate plasma. Further, the deep space formed in the multilayer film IL may be a hole having a cross-sectional shape other than a circular shape.

In step ST23 as illustrated in FIG. 9, a carbon-containing reaction product was deposited on the surface of the mask CM formed on the multilayer film IL by exciting the fifth gas. However, in an exemplary embodiment, a carbon-containing reaction product may be deposited on a surface of a mask on a single silicon-containing layer. For example, step ST 23 may be performed after an amorphous carbon mask is formed on a silicon-containing layer having a single-layer structure, so that a step of the amorphous carbon mask may be reduced. Subsequently, the silicon-containing layer having a single-layer structure may be etched through the amorphous carbon mask having a reduced step so that a difference between etching rates in the X direction and the Y direction may be reduced. Accordingly, holes HL in which the non-uniformity in width depending on directions is suppressed may be formed in the single silicon-containing layer. In this exemplary embodiment, a polysilicon layer or a silicon oxide layer, for example, may be used as the silicon-containing layer having a single-layer structure. Further, a gas including a fluorocarbon gas may be used as an etching gas of the silicon-containing layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a semiconductor device, the method comprising:

providing an object to be processed including a multilayer film formed by alternately laminating a first film and a second film having different dielectric coefficients within a processing container of a plasma processing apparatus; and repeatedly performing a sequence including: supplying a first gas including O2 gas or N2 gas, and a rare gas into the processing container and exciting the first gas, supplying a second gas including a fluorocarbon gas or a fluorohydrocarbon gas into the processing container and exciting the second gas, and supplying a third gas including HBr gas, a fluorine-containing gas, and a fluorocarbon gas or a fluorohydrocarbon gas into the processing container and exciting the third gas, so that the multilayer film is etched through a mask.

2. The method of claim 1, further comprising:

before the repeating of the sequence, etching the multilayer film up to a midway position along a lamination direction by supplying a fourth gas including HBr gas, a fluorine-containing gas, and a fluorocarbon gas or a fluorohydrocarbon gas into the processing container and exciting the fourth gas, wherein the multilayer film is etched from the midway position in the lamination direction in the repeating of three supplying steps.

3. The method of claim 2, wherein the fourth gas further includes at least one of $N_2$ gas, $H_2$ gas, and $CH_4$ gas.

4. The method of claim 1, wherein the third gas further includes at least one of $N_2$ gas, $H_2$ gas, and $CH_4$ gas.

5. The method of claim 1, wherein the fluorine-containing gas is $NF_3$ or $SF_6$.

6. The method of claim 1, further comprising:

before the repeating of the sequence, depositing a carbon-containing reaction product on a surface of the mask by supplying a fifth gas including HBr gas and a fluorocarbon gas into the processing container and exciting the fifth gas.

7. The method of claim 6, wherein the fifth gas further includes $BCl_3$ gas.

8. The method of claim 6, wherein the depositing further comprises applying a bias potential to the multilayer film side such that a power of 2.55 $W/cm^2$ per unit area or more is given to the multilayer film.

9. The method of claim 1, wherein the fluorocarbon gas is $C_3F_8$ gas, $C_4F_6$ gas, or $C_4F_8$ gas.

10. The method of claim 1, wherein the fluorohydrocarbon gas is $CH_2F_2$ gas, $CH_3F$ gas, or $CHF_3$ gas.

11. The method of claim 1, wherein the first film is a silicon oxide film, and the second film is a silicon nitride film.

12. The method of claim 1, wherein the first film is a silicon oxide film, and the second film is a polysilicon film.

13. The method of claim 1, wherein the first film and the second film are laminated in total of twenty four layers or more.

14. The method of claim 1, wherein the mask is made of amorphous carbon.

* * * * *